United States Patent [19]
Tanitsu et al.

[11] Patent Number: 5,963,306
[45] Date of Patent: Oct. 5, 1999

[54] EXPOSURE APPARATUS AND METHODS FOR USING THE SAME

[75] Inventors: Osamu Tanitsu, Funabashi; Kayo Sugiyama, Yokohama, both of Japan

[73] Assignee: Nikon Corporation, Tokyo, Japan

[21] Appl. No.: 08/989,624

[22] Filed: Dec. 12, 1997

[30]     Foreign Application Priority Data

Dec. 13, 1996 [JP] Japan ................................... 8-353022
Oct. 22, 1997 [JP] Japan ................................... 9-307953

[51] Int. Cl.⁶ .......................... G03B 27/54; G03B 27/42
[52] U.S. Cl. ................................. 355/67; 355/53
[58] Field of Search .................. 355/53, 30, 67, 355/77, 122, 133; 356/399, 400, 401; 250/491.1, 492.2

[56]          References Cited

U.S. PATENT DOCUMENTS

| | | | |
|---|---|---|---|
| 4,724,466 | 2/1988 | Ogawa et al. ........................... | 355/53 |
| 4,851,978 | 7/1989 | Ichihara ................................... | 362/268 |
| 4,918,583 | 4/1990 | Kudo et al. .............................. | 362/268 |
| 4,939,630 | 7/1990 | Kikuchi et al. .......................... | 362/268 |
| 5,187,519 | 2/1993 | Takabayashi et al. ................... | 355/53 |
| 5,204,711 | 4/1993 | Takubo et al. ........................... | 355/53 |
| 5,245,384 | 9/1993 | Mori ........................................ | 355/67 |
| 5,798,823 | 8/1998 | Kudo ....................................... | 355/67 |

*Primary Examiner*—Safet Metjahic
*Assistant Examiner*—Hung Henry Nguyen
*Attorney, Agent, or Firm*—Klarquist Sparkman Campbell Leigh & Whinston, LLP

[57]          ABSTRACT

Projection-exposure photolithography apparatus are disclosed that include a light source supported by a first structural body, an illumination optical system that is supported by a second structural body isolated from the first structural body, a first light-collecting system supported by the first structural body, and a second light-collecting system supported by the second structural body. The illumination optical system includes, at its incident side, a surface conjugate to a mask defining a mask pattern. Light reaches the incident surface from the second light-collecting system. The apparatus is arranged such that a prescribed surface and the exit plane of the light source are optically conjugate relative to each other by way of the first light-collecting system and the second light-collecting system.

16 Claims, 6 Drawing Sheets

EXPOSURE APPARATUS AND METHODS FOR USING THE SAME

FIELD OF THE INVENTION

The present invention concerns projection-exposure apparatus and methods employing a projection-exposure apparatus for manufacturing semiconductor devices, and in particular such apparatus and methods employing an excimer laser light source.

BACKGROUND OF THE INVENTION

Projection-exposure apparatus for manufacturing semiconductor elements, liquid crystal display elements, and the like, tend to be large and bulky, and require a large area of floor space for their installation. Such exposure apparatus generally employ mercury lamps, laser light sources, or the like as light sources. Laser light sources, particularly excimer laser light sources, are extremely large compared to light sources such as mercury lamps. Accordingly, particularly with exposure apparatus employing excimer laser light sources, it is necessary to arrange the light source separately from the exposure apparatus main assembly. To allow effective utilization of clean room floor space, the excimer laser light source is sometimes installed on a floor level beneath the floor of the clean room housing the exposure apparatus. Such lower rooms frequently have a lower cleanliness rating.

A projection-exposure apparatus typically employs an optical integrator to uniformly illuminate the mask. The optical integrator must be illuminated with high efficiency by light from the light source. However, where an excimer laser light source and an exposure apparatus main assembly are installed on different floor levels, floor deformation and displacement of one floor level relative to the other floor level can cause misalignment of the light beam that illuminates the optical integrator. Such misalignment results in reduced illuminance and reduced uniformity of the illuminance profile at the photosensitive substrate (i.e., the surface being exposed).

In an alternative clean room arrangement, an excimer laser light source and an associated exposure apparatus main assembly are sometimes secured to a "grating" or the like installed some distance above a common floor, wherein a space located between the floor and the grating are utilized for plumbing and other utilities. In such cases, deformation or other displacement of the grating, which tends to be more easily deformed than a floor, can cause misalignment of the light beam that illuminates the optical integrator, resulting in reduced illuminance, and reduced uniformity of the illuminance profile, at the photosensitive substrate. It is desirable to avoid such deleterious effects. Effective utilization of any space between the excimer laser light source and the exposure apparatus main assembly (supported on a grating by the same floor system) is also desirable.

SUMMARY OF THE INVENTION

The present invention provides, inter alia, a projection-exposure apparatus in which, even when the light source apparatus and the exposure apparatus main assembly are supported by different structural bodies in a building, the illuminance profile at the surface being exposed is not easily affected by deformation or relative displacement of the respective structural bodies. The present invention also encompasses methods for manufacturing, using such projection-exposure apparatus, a semiconductor device or other device requiring projection exposure during manufacture.

The present invention further provides exposure apparatus wherein, even when the light source apparatus and the exposure apparatus main assembly are supported by the same structural body by way of, for example, a grating, the illuminance profile at the surface being exposed is not easily affected by deformation or the like of the grating or structural body, and wherein effective utilization of the space between the light-source apparatus and the exposure apparatus main assembly is facilitated. The present invention also encompasses methods for manufacturing a semiconductor device employing such an exposure apparatus.

An exposure apparatus according to the present invention comprises a light source to be supported by a first structural body, an illumination optical system to be supported by a second structural body that is substantially isolated from the first structural body, a first light-collecting system supported by the first structural body and for condensing light from the light source, and a second light-collecting system supported by the second structural body and for guiding, to the illumination optical system, light that has been condensed by the first light-collecting system. The illumination optical system comprises, at its incident side, a surface or plane that is conjugate to the mask or mask plane. The surface and the exit plane of the light source are rendered substantially optically conjugate relative to each other by the first light-collecting system and the second light-collecting system, so that a prescribed pattern formed on a mask may be reliably and uniformly illuminated.

In a preferred embodiment of an apparatus according to the present invention, the illumination optical system comprises an optical integrator for forming multiple light-source images using light from the second light-collecting system, and a condenser optical system that condenses light from the multiple light-source images formed by the optical integrator for illuminating the mask. The optical integrator is then arranged such that its entrance plane essentially coincides with the surface. The light source preferably comprises an excimer laser light source. The first light-collecting system condenses a collimated light beam from the excimer laser light source, and the second light-collecting system recollimates the light beam that was first condensed by the first light-collecting system.

According to an alternative embodiment of the present invention, an exposure apparatus comprises a first light-collecting system that condenses a light beam from a light source and a second light-collecting system that guides, to an illumination optical system, the light beam that has been condensed by the first light-collecting system. A first support body supports the first light-collecting system and a second support body, independent of the first support body, supports the second light-collecting system. The first and second light collecting systems are preferably arranged such that an exit plane of the light source is optically conjugate to an entrance plane of the illumination optical system, which in turn is optically conjugate to a mask plane at which a mask is to be illuminated. The illumination optical system preferably comprises an optical integrator, and the entrance plane of the illumination optical system is preferably located at the entrance plane of the optical integrator.

The present invention also encompasses methods for manufacturing a semiconductor device employing an exposure apparatus according to the present invention, so as to achieve improved exposure of a photosensitive substrate.

Embodiments of the present invention are not limited to the structures and configurations as summarized above. Further objects and advantages of the present invention will be apparent to those of ordinary skill in the art from the following description, which proceeds with reference to the accompanying figures, by way of non-limiting exemplary embodiments of the present invention.

BRIEF DESCRIPTION OF THE DRAWINGS

FIG. 4 is a schematic diagram of the exposure apparatus of FIG. 1, wherein the upper-level floor system A of FIG. 1 is deformed so as to become convex, as viewed from below, due to the weight of the exposure apparatus main assembly or the like.

DETAILED DESCRIPTION

According to general aspects of apparatus according to the present invention, a first light-collecting system and a second light-collecting system constitute a relay optical system. The laser exit plane of a light source such as an excimer laser light source, and the entrance plane of an optical integrator are arranged so as to be optically conjugate to each other. The first light-collecting system can be supported, together with the excimer laser light source, by a first structural body. The second light-collecting system can be supported, together with the optical integrator, by a second structural body that is substantially isolated from the first structural body.

As described below in the example embodiments, whenever the light source and the exposure apparatus main assembly are supported by different structural bodies, the relay optical system operates such that the illuminance profile at the surface being exposed (e.g., photosensitive wafer) is essentially unaffected by deformation or displacement of the first and/or second structural bodies relative to each other. As a result, a projection-exposure apparatus according to the present invention produces a uniform illuminance profile at the surface being exposed, thereby allowing stable and satisfactory exposure to be performed. Accordingly, use of a projection-exposure apparatus according to the present invention facilitates production of a satisfactory semiconductor device.

Figure 1:
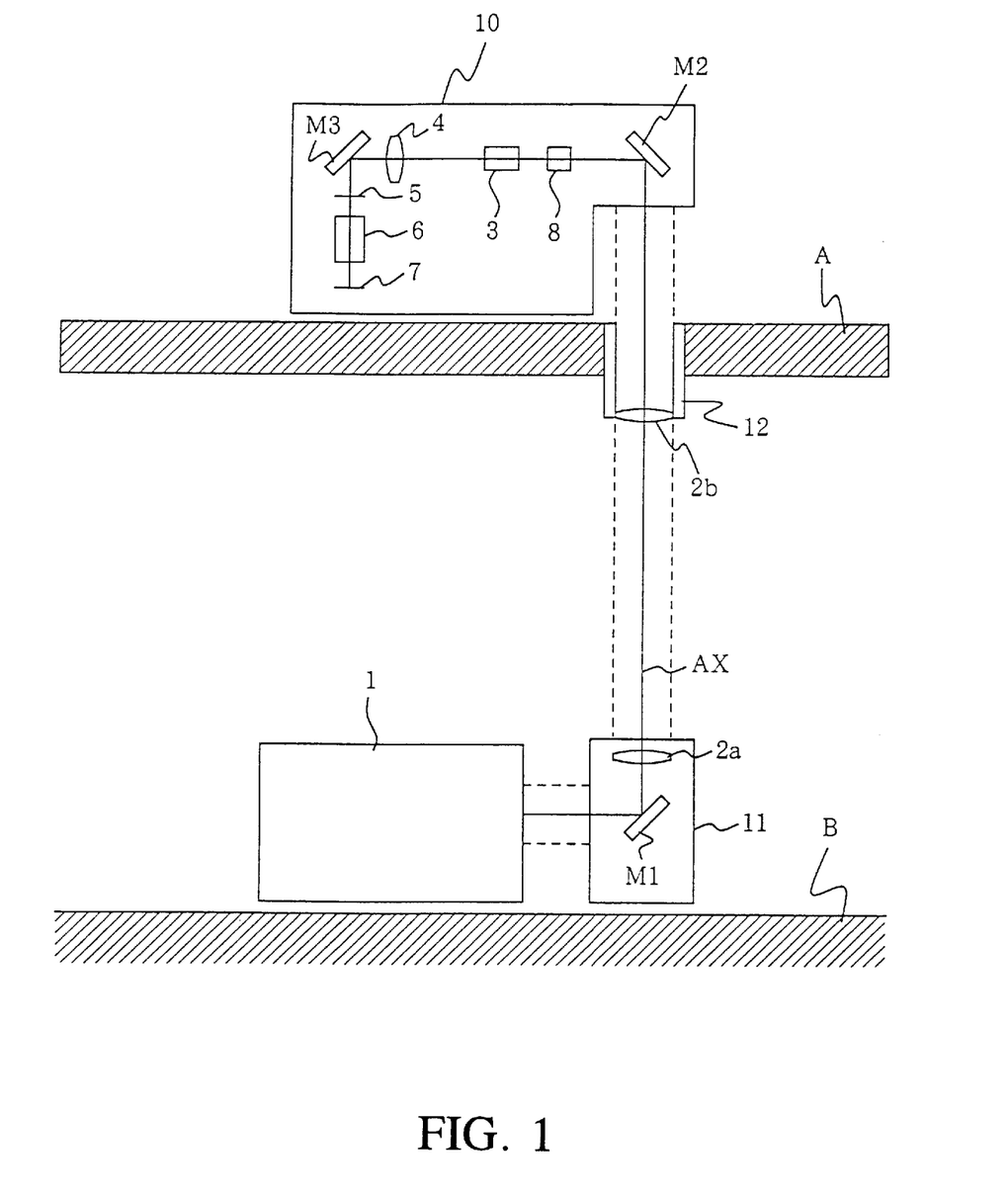
FIG. 1 is a schematic diagram of a first example embodiment of a projection-exposure apparatus according to the present invention.

FIG. 1 is a schematic diagram showing certain features of a projection-exposure apparatus according to a first example embodiment of the present invention.

The exposure apparatus of FIG. 1 comprises an excimer laser light source 1 (as a representative light source) that emits light, for example, of wavelength $\lambda=248$ nm or $\lambda=193$ nm. A collimated light beam propagating in a horizontal direction in the figure from the excimer laser light source 1 is deflected in a vertical direction in the figure by a cornering mirror M1. The light beam is incident upon a first light-collecting lens 2a. The light beam is condensed by the first light-collecting lens 2a and recollimated by a second light-collecting lens 2b. The recollimated light beam is deflected in a horizontal direction in the figure by the cornering mirror M2, and is incident upon a beam expander 8 that comprises, for example, a pair of cylindrical lenses.

The light beam is enlarged by the beam expander 8 in two dimensions in a plane perpendicular to the optical axis AX, so as to make the transverse dimensions of the light beam essentially the same as the transverse dimensions of the entrance plane of an optical integrator 3. The optical integrator 3 is preferably configured as a fly-eye lens, for example.

The optical integrator 3 preferably comprises multiple lenses that separate and condense light passing therethrough into multiple light-source images at the back focus of the optical integrator. Light from the multiple light-source images are incident upon a condenser lens 4.

Light from the multiple light-source images is reflected by a cornering mirror M3 and condensed by the condenser lens 4 so as to superimpose the light-source images on each other. The superimposed light-source images illuminate a mask 5 that defines a prescribed pattern for projection exposure. The light beam is transmitted though the mask 5 and through a projection optical system 6 to form an image of the mask pattern on a photosensitive wafer 7 (or other suitable photosensitive substrate). The mask 5 is mounted on a mask stage (not shown) in a plane perpendicular to the optical axis of the projection optical system 6. The wafer 7 is mounted on a wafer stage (not shown) that is preferably movable in two dimensions within a plane perpendicular to the optical axis of the projection optical system 6.

Exposure is conducted while moving the wafer stage, and thus the wafer 7, relative to the projection optical system 6. Thus, the mask pattern is sequentially transferred to respective exposure regions on the wafer 7.

In the first example embodiment, the cornering mirror M1 and the first light-collecting lens 2a are supported by a support body 11. The excimer laser light source 1 and the support body 11 (and thus the cornering mirror M1 and the first light-collecting lens 2a) are supported by a lower-level floor system B, which serves as a first structural body.

The cornering mirror M2 is supported by an exposure apparatus main assembly 10 that comprises the optical integrator 3. The second light-collecting lens 2b is supported by a support body 12. The exposure apparatus main assembly 10 and the support body 12 (and thus the second light-collecting lens 2b) are supported by an upper-level floor system A that serves as a second structural body. The second structural body is substantially isolated from the first structural body.

Flexible conduits or the like extend between the excimer laser light source 1 and the support body 11, between the support body 11 and the support body 12, and between the exposure apparatus main assembly 10 and the support body 12, as indicated by the broken lines in FIG. 1. The flexible conduits prevent any light propagating therethrough from being affected by changes and air currents in the surrounding environment. (In FIGS. 3 and 4, described below, such flexible conduits are omitted for simplicity of illustration.)

Figure 2:
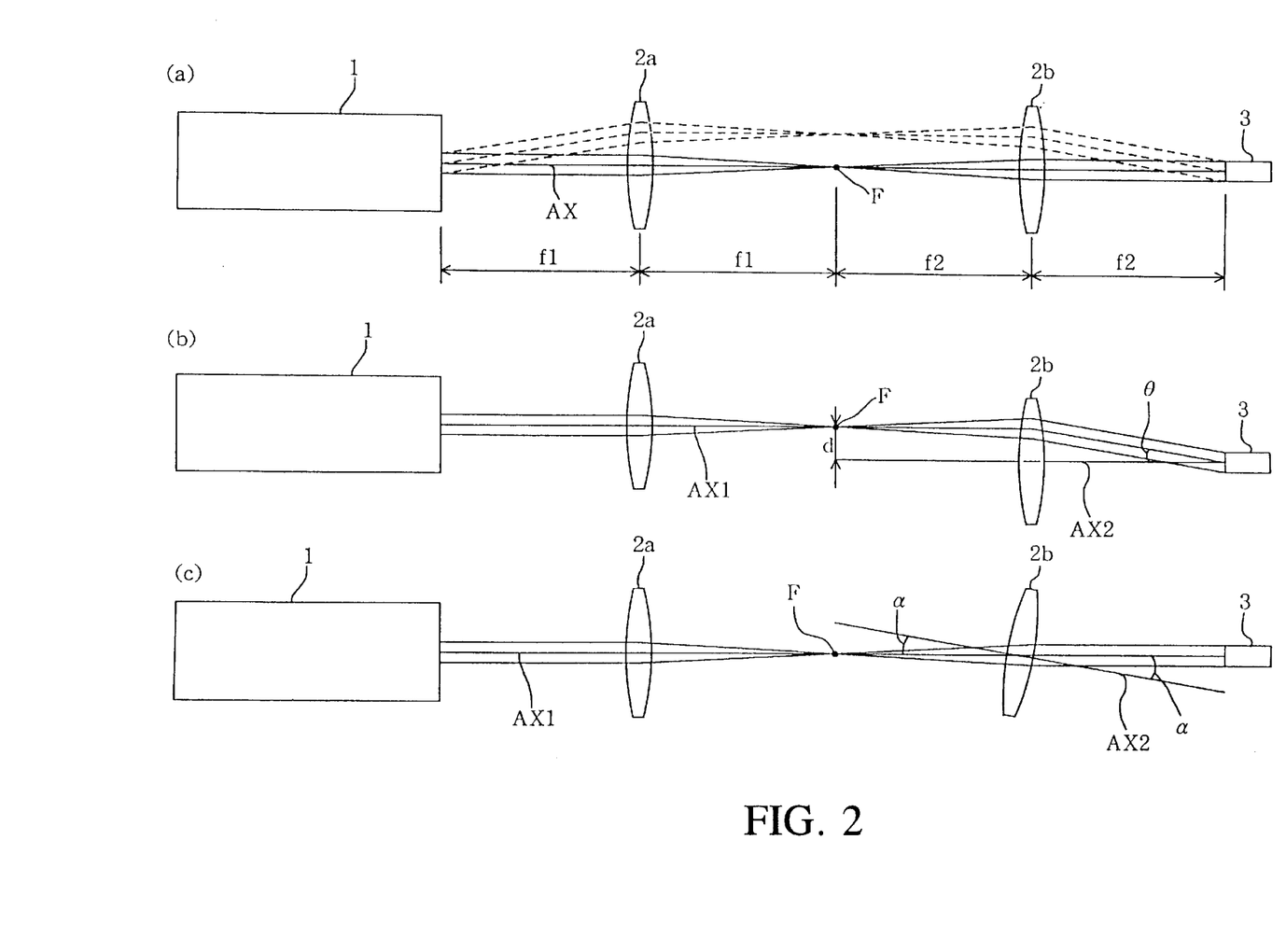
FIGS. 2(a)–2(c) are schematic diagrams of an optical path from the excimer laser light source 1 to the optical integrator 3 of FIG. 1, illustrating some effects of the present invention.

FIGS. 2(a)–2(c) depict the optical path from the excimer laser light source 1 to the optical integrator 3. (For simplicity, FIGS. 2(a)–2(c) do not show the cornering mirrors M1 and M2, or the beam expander 8.)

In FIG. 2(a), a collimated light beam (indicated by solid lines in the drawing) propagating along the optical axis AX from the excimer laser light source 1 is incident upon the first light-collecting lens 2a (having a focal length f1). The first light-collecting lens 2a condenses the light beam onto a point F residing on the optical axis AX. The light beam is recollimated by the second light-collecting lens 2b (having a focal length f2). The recollimated beam is then incident upon the optical integrator 3.

The exit plane of the excimer laser light source 1 is situated at the front focal plane of the first light-collecting lens 2a. The entrance plane of the optical integrator 3 is situated at the back focal plane of the second light-collecting lens 2b. Thus, the first light-collecting lens 2a and the second light-collecting lens 2b are situated such that the exit plane of the excimer laser light source 1 and the entrance plane of optical integrator 3 are optically conjugate to each other.

Accordingly, even if the excimer laser light source 1 is oriented obliquely with respect to the optical axis AX, the collimated light beam (indicated by broken lines in FIG. 2(a)) emitted from the excimer laser light source 1 obliquely with respect to the optical axis AX reaches the entrance plane of the optical integrator 3 with no positional misalignment, despite any angular misalignment.

Figure 3:
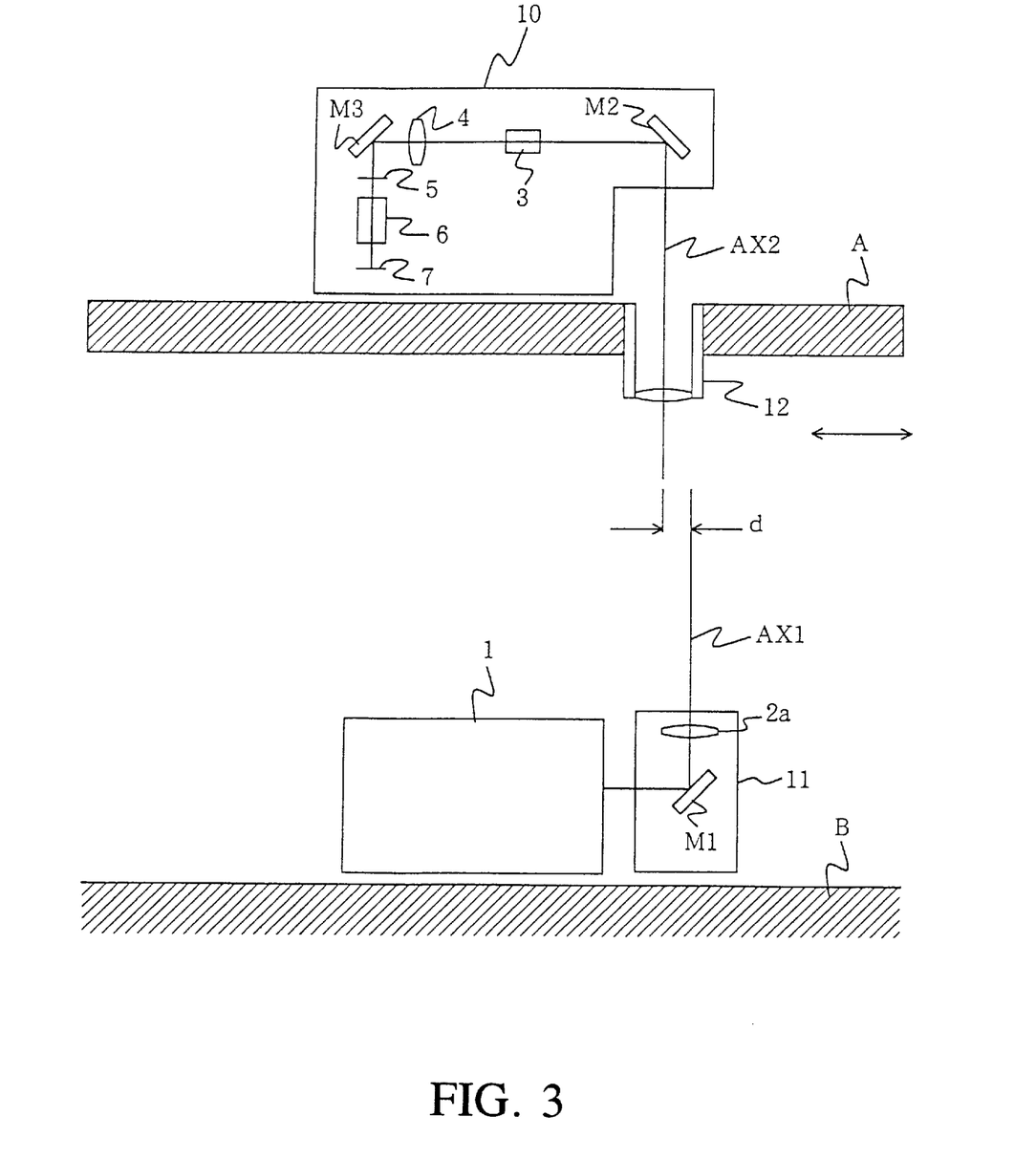
FIG. 3 is a schematic diagram of the exposure apparatus of FIG. 1, wherein the upper-level floor system A of FIG. 1 is displaced with respect to the lower-level floor system B in a horizontal direction by a prescribed amount d.

In the first example embodiment, the excimer laser light source 1 and the first light-collecting lens 2a are supported by the lower-level floor system B, and the second light-collecting lens 2b and the optical integrator 3 are supported by the upper-level floor system A. Accordingly, as shown in FIG. 3, if the upper-level floor system A is displaced with respect to the lower-level floor system B in a horizontal direction by an amount d, then the optical axis AX1 of the first light-collecting lens 2a and the optical axis AX2 of the second light-collecting lens 2b will be misaligned in a horizontal direction (in the figure) by an amount d. That is, in FIG. 2(b) (which is a diagram of the optical path corresponding to the situation shown in FIG. 3), the optical axis AX1 of the first light-collecting lens 2a and the optical axis AX2 of the second light-collecting lens 2b will be misaligned in a vertical direction (in the figure) by the amount d. However, as was the case with the light beam indicated by broken lines in FIG. 2(a), the light beam in FIG. 2(b) reaches the entrance plane of the optical integrator 3 without exhibiting any positional misalignment despite the angular misalignment of θ=d/f2. In actual practice, the focal length f2 of the second light-collecting lens 2b can be large compared to the relative displacement d of the floor systems, so any effect of the angular misalignment θ on the illuminance profile at the surface being exposed is so small that the effect can be ignored.

Figure 4:
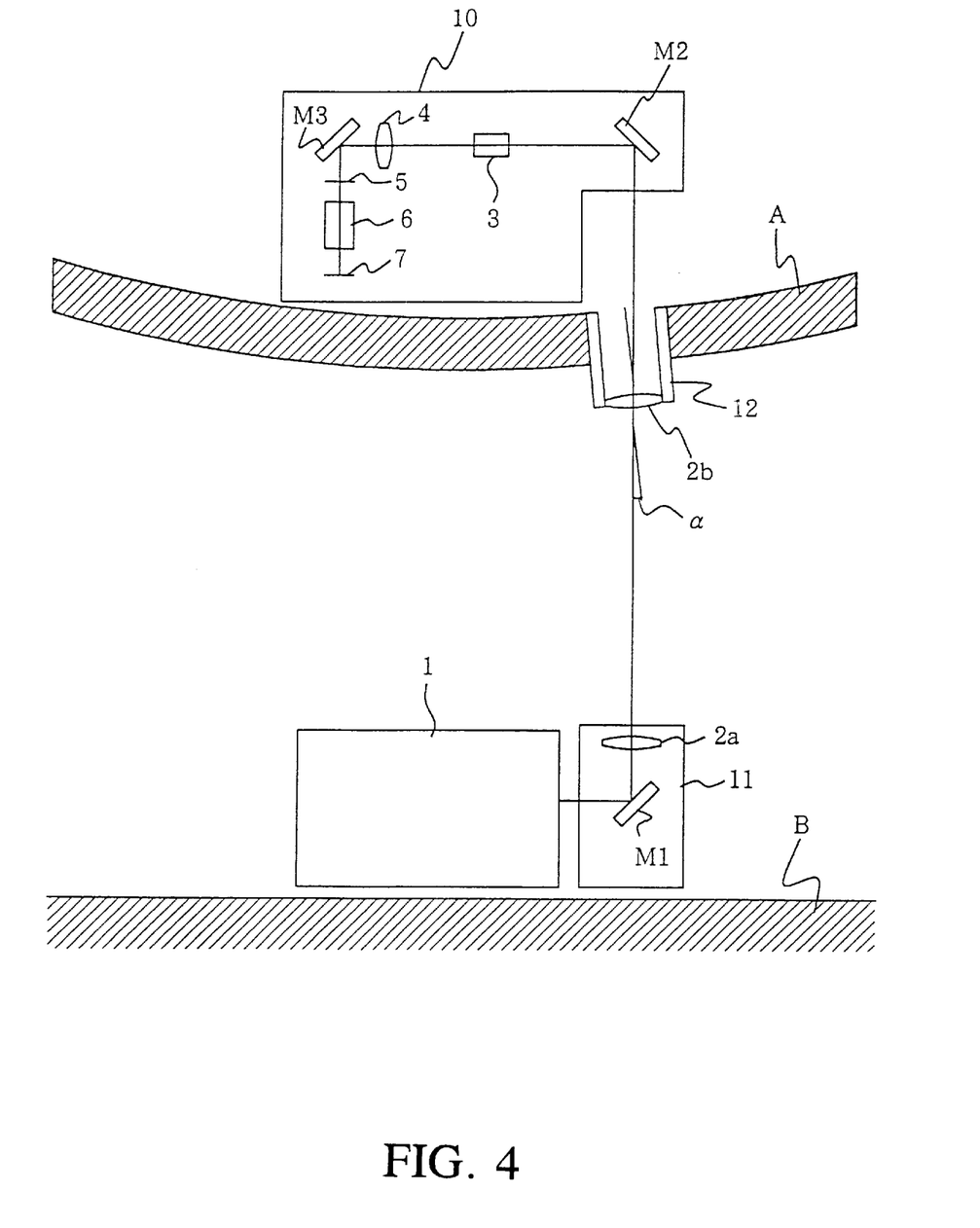

As shown in FIG. 4, if (due, e.g., to the weight of the exposure apparatus main assembly or the like) the upper-level floor system A is deformed so as to become convex as viewed from below, the optical axis AX2 of the second light-collecting lens 2b will become oblique by an angle α relative to the optical axis AX1 of the first light-collecting lens 2a. That is, as shown in FIG. 2(c) (showing the optical path in a situation such as that shown in FIG. 4), the optical axis AX2 of the second light-collecting lens 2b becomes oblique by the angle α relative to the optical axis AX1 of the first light-collecting lens 2a. However, as shown in FIG. 2(c), the light beam, having passed through the second light-collecting lens 2b (which is slightly oblique with respect to the optical axis AX1), reaches the entrance plane of the optical integrator 3 with almost no angular misalignment or positional misalignment. Accordingly, any effect of obliqueness of the optical axis AX2 of the second light-collecting lens 2b on the illuminance profile at the surface being exposed is so small that the effect can be ignored.

If the floor system A experiences both a slight relative displacement in a horizontal direction with respect to the floor system B, and a slight relative inclination with respect to the floor system B, by analogy with the situation depicted at FIG. 2(b) and the situation depicted at FIG. 2(c), any effect on the illuminance profile at the surface being exposed is so small that the effect can be ignored.

In the first example embodiment, the first light-collecting lens 2a and the second light-collecting lens 2b constitute a relay lens system in which the exit plane of the excimer laser light source 1 and the entrance plane of the optical integrator 3 are substantially conjugate to each other. The first light-collecting lens 2a is supported by the floor system B integrally with the excimer laser light source 1, and the second light-collecting lens 2b is supported by the floor system B integrally with the optical integrator 3. Accordingly, as described above, even when the floor system A experiences either or both of (1) a slight relative displacement in a horizontal direction (in the figure) relative to the floor system B, and (2) a slight relative inclination relative to the floor system B, the action of the relay lens system achieves a uniform illuminance profile at the wafer 7. As a result, the exposure apparatus of the first example embodiment permits stable and satisfactory exposures to be performed.

Figure 5:
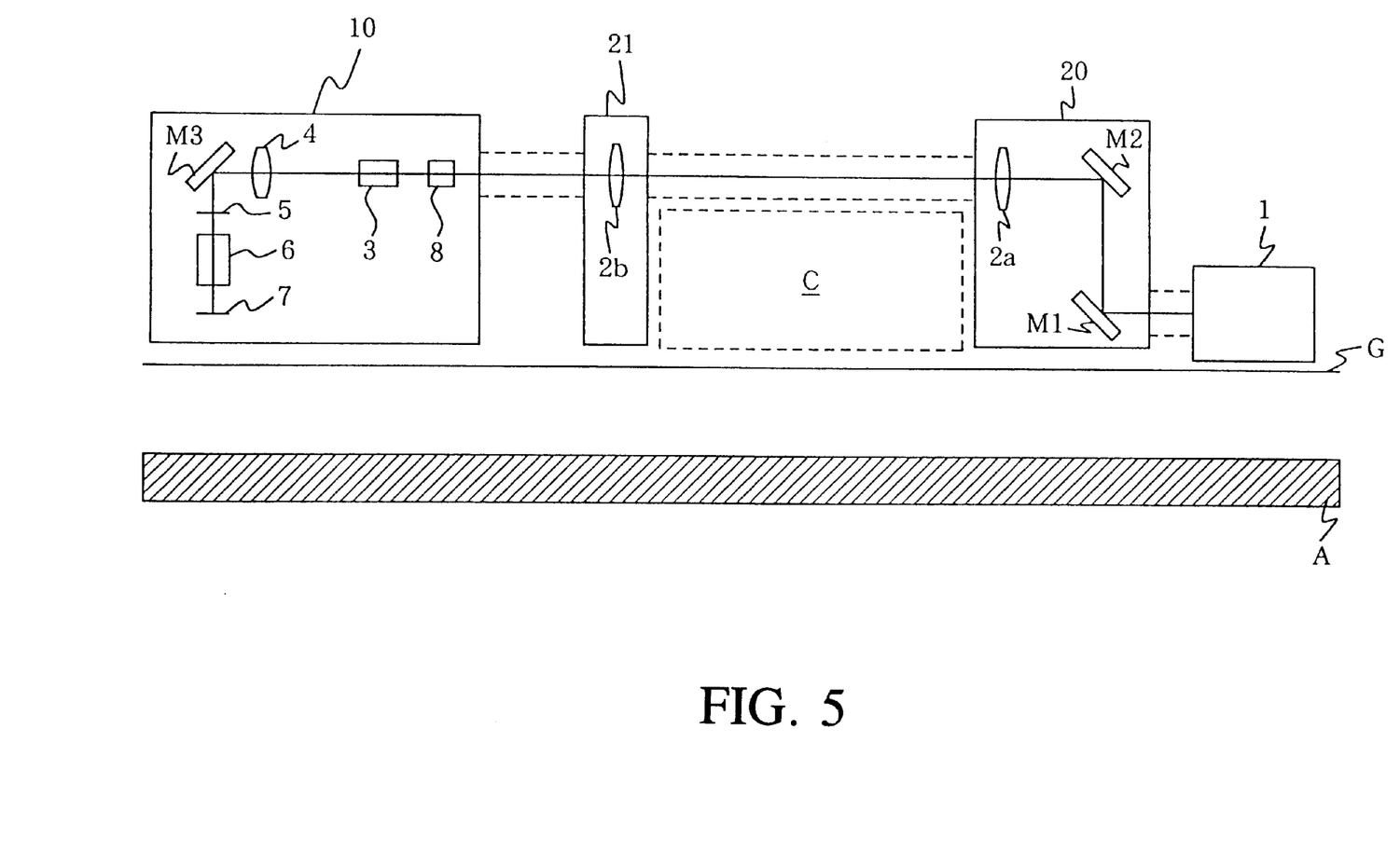
FIG. 5 is a schematic diagram of a second embodiment of a projection-exposure apparatus according to the present invention.

FIG. 5 is a schematic diagram of a projection-exposure apparatus according to a second example embodiment of the present invention. The second example embodiment shares certain similarities with the first example embodiment. However, as explained below, the arrangement and manner by which certain structures in the second example embodiment are supported differ from the first example embodiment. In FIG. 5, components that are the same as in the first example embodiment are denoted using the same reference designators and are not described further.

In the second example embodiment, the collimated light beam, supplied horizontally and to the left (in the figure) from an excimer laser light source 1, is deflected vertically upward (in the figure) by a cornering mirror M1. The light beam is then incident upon a cornering mirror M2 that deflects the light beam horizontally toward the left (in the figure) to be incident upon a first light-collecting lens 2a.

The light-collecting lens 2a condenses the light beam which is subsequently recollimated by passage through a second light-collecting lens 2b. The recollimated light beam is incident upon a beam expander 8 within the exposure apparatus main assembly 10. The cornering mirror M1, the cornering mirror M2, and the first light-collecting lens 2a are all supported by a support body 20, and the second light-collecting lens 2b is supported by a support body 21 comprising a support structure that is independent of the support body 20.

Flexible conduits preferably extend between the excimer laser light source 1 and the support body 20, between the support body 20 and the support body 21, and between the exposure apparatus main assembly 10 and the support body 21, as indicated by the broken lines in FIG. 5. The conduits prevent light propagating therethrough from being affected by external air currents and other changes in the external environment.

In the second example embodiment, as shown in FIG. 5, the excimer laser light source 1, the support body 20 (and thus the cornering mirror M1, the cornering mirror M2, and the first light-collecting lens 2a), the support body 21 (and thus the second light-collecting lens 2b), and the exposure apparatus main assembly 10 are all supported by a structural body such as, for example, a grating G. The grating G is supported by a floor system A. Hence, the excimer laser light source 1, the first light-collecting lens 2a, the second light-collecting lens 2b, and the exposure apparatus main assembly 10 are all supported by the same structural body (i.e., the floor system A), by way of the grating G. The space between the grating G and the floor system A can be used for routing utilities.

As in the first example embodiment, the first light-collecting lens 2a and the second light-collecting lens 2b of the second example embodiment constitute a relay lens system in which the exit plane of the excimer laser light source 1 and the entrance plane of the optical integrator 3 have a conjugate relationship with each other. That is, wherein the focal length of the first light-collecting lens 2a is denoted f1 and the focal length of the second light-collecting lens 2b is denoted f2, the exit plane of the excimer laser light source 1 and the first light-collecting lens 2a are separated by a distance f1 along the optical axis, the first light-collecting lens 2a and the second light-collecting lens 2b are separated by a distance (f1+f2) along the optical axis, and the second light-collecting lens 2b and the entrance plane of the optical integrator 3 are separated by a distance f2 along the optical axis.

Because the first light-collecting lens 2a and the second light-collecting lens 2b comprise a relay lens system in which the laser exit plane of the excimer laser light source 1 and the entrance plane of the optical integrator 3 have a conjugate relationship with each other, satisfactory illumination of the entrance plane of the optical integrator 3 is achieved. No positional misalignment arises despite any angular misalignment that might be experienced by the excimer laser light source 1. Also, the first light-collecting lens 2a is supported by the support body 20 (which is comparatively near the excimer laser light source 1) and the second light-collecting lens 2b is supported by the support body 21 (which is comparatively near the exposure apparatus main assembly 10). Hence, even if the floor system A and/or the grating G should experience a certain degree of deformation (producing a relative displacement between the excimer laser light source 1 and the exposure apparatus main assembly 10), the action of the relay lens system permits a uniform illuminance profile to be obtained at the wafer 7. In addition, because the optical axis between the support body 20 and the support body 21 is situated high above the grating G, any underlying space C (indicated by broken lines in the figure) can be utilized as required for equipment and utilities, for example.

Figure 6:
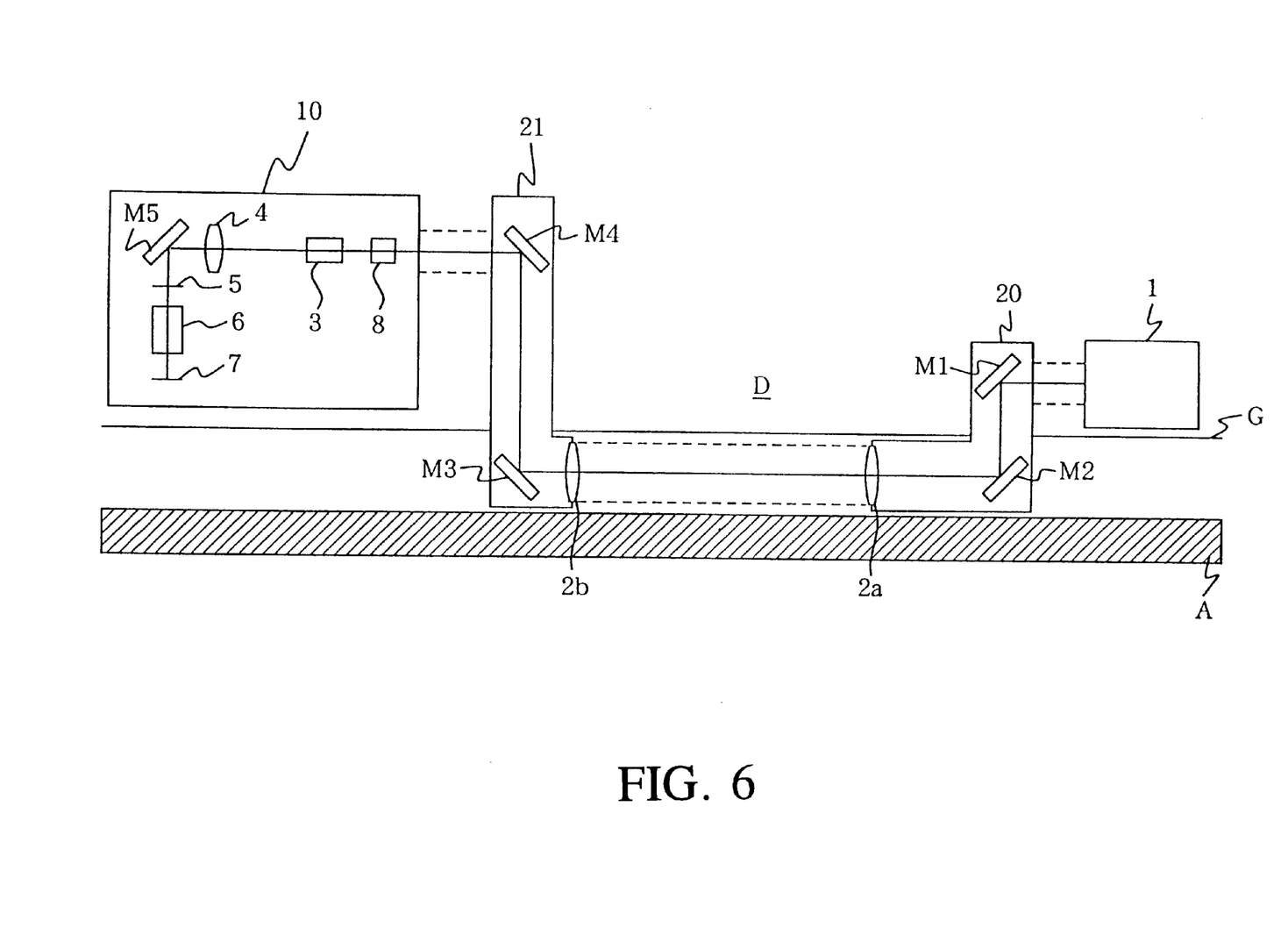
FIG. 6 is a schematic diagram of a third embodiment of a projection-exposure apparatus according to the present invention.

FIG. 6 is a schematic diagram of an exposure apparatus according to a third example embodiment of the present invention. The third example embodiment shares certain similarities with the first and second example embodiments, except that the arrangement and manner by which certain components of the third example embodiment are supported differ from the first and second example embodiments. In FIG. 6, components that are the same as in the second example embodiment have the same reference designators and are not described further.

In the third example embodiment, the collimated light beam supplied horizontally toward the left (in the figure) from an excimer laser light source 1 is deflected vertically downward by a cornering mirror M1. The light beam is then incident upon a cornering mirror M2 which deflects the light beam horizontally toward the left (in the figure). The light beam is then incident upon a first light-collecting lens 2a which condenses the light beam.

The light beam is recollimated by a second light-collecting lens 2b, and is then incident upon a cornering mirror M3. The recollimated light beam is deflected vertically upward (in the figure) by the cornering mirror M3, deflected horizontally toward the left (in the figure) by a cornering mirror M4, and is incident upon a beam expander 8 within an exposure apparatus main assembly 10. The first light-collecting lens 2a, the cornering mirror M1, and the cornering mirror M2 are supported by a support body 20. The second light-collecting lens 2b, the cornering mirror M3, and the cornering mirror M4 are supported by a support body 21 that comprises a support structure that is independent of the support body 20.

Flexible conduits or the like preferably extend between the excimer laser light source 1 and the support body 20, between the support body 20 and the support body 21, and between the exposure apparatus main assembly 10 and the support body 21, as indicated by the broken lines in FIG. 6. The flexible conduits protect light propagating therethrough from the external environment and from air movement.

In the third example embodiment, as shown in FIG. 6, the excimer laser light source 1 and the exposure apparatus main assembly 10 are supported by a structural body such as, for example, a grating G. The grating G, the support body 20 (and thus the cornering mirror M1, the cornering mirror M2, and the first light-collecting lens 2a), and the support body 21 (and thus the second light-collecting lens 2b, the cornering mirror M3, and the cornering mirror M4) are supported by the floor system A. In other words, the excimer laser light source 1, the exposure apparatus main assembly 10, the first light-collecting lens 2a, and the second light-collecting lens 2b are all ultimately supported by the same structural body (i.e., the floor system A). The excimer laser light source 1 and the exposure apparatus main assembly 10 are supported by the floor system A and the grating G. The first light-collecting lens 2a and the second light-collecting lens 2b are supported by the floor system A but not by the grating G.

As in the first example embodiment and the second example embodiment, the first light-collecting lens 2a and the second light-collecting lens 2b comprise a relay lens system in which the exit plane of the excimer laser light source 1 and the entrance plane of the optical integrator 3 have a conjugate relationship with each other. Wherein the focal length of the first light-collecting lens 2a is denoted f1 and the focal length of the second light-collecting lens 2b is denoted f2, the exit plane of the excimer laser light source 1 and the first light-collecting lens 2a are separated from each other by a distance f1 along the optical axis, the first light-collecting lens 2a and the second light-collecting lens 2b are separated from each other by a distance (f1+f2) along the optical axis, and the second light-collecting lens 2b and the entrance plane of the optical integrator 3 are separated from each other by a distance f2 along the optical axis.

In the third example embodiment, because the first light-collecting lens 2a and the second light-collecting lens 2b comprise a relay lens system in which the exit plane of the excimer laser light source 1 and the entrance plane of the optical integrator 3 have a conjugate relationship to each other, satisfactory illumination of the entrance plane of the optical integrator 3 is achieved. Also, positional misalignment does not arise despite any angular misalignment that might be experienced by the excimer laser light source 1. Furthermore, because the first light-collecting lens 2a is supported by the support body 20 (which is comparatively near the excimer laser light source 1) and the second light-collecting lens 2b is supported by the support body 21 (which is comparatively near the exposure apparatus main assembly 10), even if the floor system A or the grating G should experience a certain degree of deformation that produces a relative displacement between the excimer laser light source 1 and the exposure apparatus main assembly 10, the action of the relay lens system permits a uniform illuminance profile to be obtained at the wafer 7. In addition, because the optical axis between the support body 20 and the support body 21 is situated below the grating G, the space D (defined by the support body 20, the support body 21, and the grating G) can be effectively utilized.

In the second example embodiment and the third example embodiment, the excimer laser light source 1, the first light-collecting lens 2*a*, the second light-collecting lens 2*b*, and the exposure apparatus main assembly 10 are all ultimately supported by the same structural body (i.e., the floor system A). However, in the second example embodiment and the third example embodiment, it is also possible to employ an arrangement similar to that of the first example embodiment, wherein the excimer laser light source 1 and the first light-collecting lens 2*a* are supported by a first structural body (e.g., a floor system A), and the second light-collecting lens 2*b* and the exposure apparatus main assembly 10 are supported by a second structural body (e.g., a separate floor system B) that is substantially isolated from the first structural body.

A wafer that been photolithographically exposed using a projection-exposure apparatus according to the present invention is subsequently "developed", etched (to remove material from regions not protected by the resist), "stripped" to remove residual resist after the etching step, and so forth, until wafer processing is completed. Following completion of wafer processing, a semiconductor device such as an LSI is ultimately manufactured, by means of assembly operations such as a dicing operation wherein the wafer is cut into chips such that each such chip comprises one of the circuits exposed thereon, a bonding operation wherein each chip is provided with electrical leads and the like, and a packaging operation wherein each chip is separately packaged, and so forth.

While the example method described above is directed particularly to the manufacture of semiconductor integrated circuit elements by a process including a photolithographic step employing an apparatus according to this invention, it will be appreciated that the apparatus and methods of this invention can be used to fabricate any of various other semiconductor devices, such as liquid crystal display elements, thin-film magnetic heads, and image pickup elements (CCD elements, etc.).

Whereas each of the example embodiments described above preferably comprises an excimer laser emitting a collimated light beam as the light source, apparatus according to the present invention can alternatively comprise an ordinary light source.

In each of the example embodiments described above, a beam expander 8 was situated on the optical axis between the relay lens system (lenses 2*a* and 2*b*) and the optical integrator 3. However, the beam expander 8 can be omitted by appropriately setting the ratio of the focal length f1 of the first light-collecting lens 2*a* to the focal length f2 of the second light-collecting lens 2*b*.

Each of the foregoing example embodiments was specifically described in the context of a step-and-repeat-type projection-exposure apparatus with which a mask pattern is exposed onto respective exposure regions of a wafer, and the wafer is caused to move in two dimensions relative to the projection optical system during exposure. However, the present invention can also be utilized for performing step-and-scan photolithographic exposures in which respective exposure regions of the wafer are scanned during exposure, i.e., both the wafer and mask move relative to the projection optical system during the exposure. The present invention can also be utilized for performing static-scan exposures in which the entire mask pattern is exposed onto the entire exposure region of a wafer in one exposure as the wafer and mask are moved relative to each other with respect to the projection optical system.

Each of the example embodiments described above comprises an optical integrator preferably comprising a fly-eye integrator. However, optical integration can be achieved using an alternative component such as an internal-reflection-type rod-shaped optical integrator.

It will also be understood that other changes and substitutions, in addition to those mentioned above, may be made by those skilled in the art, without departing from the spirit and the scope of the invention, which is not limited to the above embodiments, but is defined instead by the literal and equivalence scope of the appended claims:

What is claimed is:

1. An exposure apparatus comprising:
   (a) a light source comprising an exit plane and supported by a first structural body;
   (b) an illumination optical system comprising an entrance plane and supported by a second structural body structurally isolated from the first structural body, the illumination optical system being arranged to receive light at the entrance plane from the light source, and to illuminate a mask at a mask plane using the light received from the light source, the entrance plane being optically conjugate with the mask plane;
   (c) a first light-collecting system, supported by the first structural body, for condensing light from the light source; and
   (d) a second light-collecting system, supported by the second structural body, for guiding, to the illumination optical system, light that has been condensed by the first light-collecting system, the first and second light-collecting systems being arranged such that the entrance plane of the illumination optical system and the exit plane of the light source are optically conjugate with each other.

2. The exposure apparatus of claim 1, wherein the illumination optical system comprises:
   an optical integrator for forming multiple light-source images using light reaching the optical integrator from the second light-collecting system, the optical integrator comprising an entrance plane; and
   a condenser optical system that condenses light from the multiple light-source images formed by the optical integrator, the condenser optical system being for illuminating the mask with superimposed light-source images, the optical integrator being arranged such that the entrance plane thereof coincides with the entrance plane of the illumination optical system.

3. The exposure apparatus of claim 1, wherein:
   the light source comprises an excimer laser light source that produces a collimated light beam;
   the first light-collecting system is situated so as to condense the collimated light beam from the excimer laser light source; and
   the second light-collecting system is situated so as to recollimate the light beam condensed by the first light-collecting system.

4. A method for manufacturing a semiconductor device, comprising the steps:

(a) providing the exposure apparatus of claim 1;

(b) providing a mask defining a prescribed mask pattern; and (c) illuminating the mask pattern using the exposure apparatus so as to expose the mask pattern onto a photosensitive substrate.

5. An exposure apparatus comprising:

(a) a light source for supplying a light beam;

(b) an illumination optical system for illuminating a mask defining a prescribed mask pattern using the light beam from the light source so as to expose the mask pattern onto a photosensitive substrate;

(c) a first light-collecting system for condensing the light beam from the light source, the first light-collecting system being supported by a first support body; and (d) a second light-collecting system for guiding, to the illumination optical system, the light beam condensed by the first light-collecting system, the second light-collecting system being supported by a second support body separate from the first support body;

wherein the light source and the first support body are supported by a first structural body, and the illumination optical systems and the second support body are supported by a second structure body isolated from the first structural body.

6. The exposure apparatus of claim 5, wherein the illumination optical system comprises an optical integrator for forming multiple light-source images using light from the second light-collecting system, and a condenser optical system for condensing light from the multiple light-source images formed by the optical integrator, the optical integrator illuminating the mask with the light-source images superimposed on each other.

7. A method for manufacturing a semiconductor device, comprising the steps of:

(a) providing the apparatus of claim 6;

(b) providing a photosensitive substrate;

(c) providing a mask defining a prescribed mask pattern; and (d) using the apparatus to expose the mask pattern onto the photosensitive substrate.

8. The exposure apparatus of claim 5, wherein the illumination optical system further comprises, at an incident side thereof, a surface that is optically conjugate to the mask, the surface and the exit plane of the light source having an optically conjugate relationship with each other.

9. The exposure apparatus of claim 8, wherein the illumination optical system further comprises, at an incident side thereof, a surface that is optically conjugate to the mask, the surface and the exit plane of the light source having an optically conjugate relationship with each other.

10. A method for manufacturing a semiconductor device, comprising the steps of:

(a) providing the apparatus of claim 5;

(b) providing a photosensitive substrate;

(c) providing a mask defining a prescribed mask pattern; and (d) using the apparatus to expose the mask pattern onto the photosensitive substrate.

11. An exposure apparatus comprising:

(a) a light source for supplying a light beam;

(b) an illumination optical system for illuminating a mask defining a prescribed mask pattern using the light beam from the light source so as to expose the mask pattern onto a photosensitive substrate;

(c) a first light-collecting system for condensing the light beam from the light source, the first light-collecting system being supported by a first support body; and (d) a second light-collecting system for guiding, to the illumination optical system, the light beam condensed by the first light-collecting system, the second light-collecting system being supported by a second support body separate from the first support body;

wherein the light source, the illumination optical system, the first support body, and the second support body are all arranged so as to be supported by one structural body.

12. The exposure apparatus of claim 11, wherein the illumination optical system further comprises, at an incident side thereof, a surface that is optically conjugate to the mask, the surface and the exit plane of the light source having an optically conjugate relationship with each other.

13. A method for manufacturing a semiconductor device comprising the steps of:

(a) providing the apparatus of claim 11;

(b) providing a photosensitive substrate;

(c) providing a mask defining a prescribed mask pattern; and (d) using the apparatus to expose the mask pattern onto the photosensitive substrate.

14. A photolithography exposure apparatus, comprising:

(a) a light source comprising an exit plane at which a collimated light beam is emitted;

(b) an illuminating optical system comprising an entrance plane optically conjugate with a mask plane, the illuminating optical system being situated so as to illuminate the mask plane using light from the light source incident to the illuminating optical system at the entrance plane;

(c) a first light-collecting system for condensing the collimated light beam, supported at a location nearer to the light source than to the illuminating optical system; and (d) a second light collecting system for re-collimating the condensed light beam, supported at a location nearer to the illuminating optical system than to the light source, the exit plane of the light source being optically conjugate with the entrance plane of the illuminating optical system, wherein the first light-collecting system is supported by a first support body, and the second light-collecting system is supported by a second support body structurally isolated from the first support body, the first and second support bodies being supported by a common support structure.

15. The apparatus of claim 14, wherein:

the first light collecting system comprises, in order in the direction of light propagation along an optical axis, a first lens system comprising front and back focal planes;

the second light collecting system comprises, in order in the direction of light propagation along the optical axis, a second lens system comprising front and back focal planes;

the exit plane of the light source is located at the front focal plane of the first lens system;

the front focal plane of the second lens system is located at the back focal plane of the first lens system; and the entrance plane of the illumination optical system is located at the back focal plane of the second lens system.

16. A method for manufacturing a semiconductor device, comprising the steps of:

(a) providing the apparatus of claim 14;

(b) providing a photosensitive substrate;

(c) providing a mask defining a prescribed mask pattern; and (d) using the apparatus to expose the mask pattern onto the photosensitive substrate.

* * * * *

UNITED STATES PATENT AND TRADEMARK OFFICE
CERTIFICATE OF CORRECTION

PATENT NO. : 5,963,306

DATED : October 5, 1999

INVENTOR(S) : Tanitsu et al.

It is certified that error appears in the above-identified patent and that said Letters Patent is hereby corrected as shown below:

In the Claims:

Column 11, line 25, "structure" should be --structural--.

Signed and Sealed this

Seventeenth Day of April, 2001

Attest:

NICHOLAS P. GODICI

Attesting Officer

Acting Director of the United States Patent and Trademark Office